US008823420B2

(12) United States Patent
Lawson et al.

(10) Patent No.: US 8,823,420 B2

(45) Date of Patent: Sep. 2, 2014

(54) SWITCH WITH COMMON-MODE CHOKE

(75) Inventors: Thomas E. Lawson, Malvern, PA (US); William H. Morong, Paoli, PA (US)

(73) Assignee: CogniPower, LLC, Malvern, PA (US)

(*) Notice: Subject to any disclaimer, the term of this patent is extended or adjusted under 35 U.S.C. 154(b) by 953 days.

(21) Appl. No.: 12/952,893

(22) Filed: Nov. 23, 2010

(65) Prior Publication Data

US 2011/0122657 A1 May 26, 2011

Related U.S. Application Data

(60) Provisional application No. 61/263,527, filed on Nov. 23, 2009.

(51) Int. Cl.

*H03K 3/00* (2006.01)
*H03K 17/042* (2006.01)
*H02M 3/155* (2006.01)

(52) U.S. Cl.

CPC ......... *H02M 3/155* (2013.01); *H03K 17/04206* (2013.01)
USPC .......................................... 327/108; 327/434

(58) Field of Classification Search

CPC .................... H01L 2924/13091; H02M 1/088; H02M 3/158
USPC ......... 327/108–112, 333, 419, 427, 434, 436, 327/437, 478, 482, 484–488; 326/63, 68, 326/75, 80–92

See application file for complete search history.

(56) References Cited

U.S. PATENT DOCUMENTS

| | | | | |
|---|---|---|---|---|
| 8,698,540 | B2 * | 4/2014 | Morong | 327/333 |
| 2009/0167412 | A1 * | 7/2009 | Morong | 327/434 |

* cited by examiner

*Primary Examiner* — William Hernandez

(74) *Attorney, Agent, or Firm* — Mendelsohn, Drucker & Dunleavy, P.C.; Steve Mendelsohn

(57) ABSTRACT

In one embodiment, a level-shifter for driving a high-side power switch with sub-nanosecond timing integrity, without requiring a high-side gate-drive power supply, is provided. A drive source is connected to the gate of a power switch through a common-mode choke, and the latter level-shifts the common-mode voltage of the drive signal to the common-mode level of the power switch. The same level-shifter may also be used to drive a low-side power switch to avoid ground bounce.

10 Claims, 5 Drawing Sheets

DREC
VP
C
SUPR
VE
SON1
A
SOFF
SON2
B
COM
TON
TOFF
CMC
100
CONTROL
OUT
SLWR
INPUT

SWITCH WITH COMMON-MODE CHOKE

CROSS-REFERENCE TO RELATED APPLICATIONS

The present application claims the benefit of U.S. Provisional Application No. 61/263,527 filed on Nov. 23, 2009, which is incorporated herein by reference

STATEMENT REGARDING FEDERALLY SPONSORED RESEARCH OR DEVELOPMENT

The present invention was not developed with the use of any Federal Funds, but was developed independently by the inventors.

BACKGROUND OF THE INVENTION

Several techniques are used in the prior art to control a power FET or IGBT used in the upper, or high-side, position of a well known "totem-pole" power circuit. If a P-channel device be used at a relatively large positive voltage, or an N-channel device for a negative voltage, a semiconductor level shifter may be used to control a current which can be dropped across a resistor to enhance the switch. This method does not require a high-side enhancement supply, but is relatively slow, limiting its utility to power-converters operating below a few tens of KHz. Sometimes opto-couplers are employed to convey control signals to high-side switches, but these usually require a floating high-side supply and also are limited in speed and timing integrity. Transformers are often used to convey ground-referred control signals to high-side switches. With these, good timing integrity can be obtained, but resetting their magnetizing currents incurs either the penalty of significant recovery time or of handling high flyback voltages. It is possible to use a relatively small transformer to convey pulses representing signal transitions from ground level to a high-side switch, which allows magnetic recovery. However, doing so requires extra circuitry to reconstruct such pulses to the original control waveform and drive circuitry for the switch, in addition to a high-side power supply for said circuitry. High-side switches may be capacitively driven from ground referred signals. If the switches be of the correct polarity to allow the high-side pole of the capacitor to be referred to the upper supply, and sufficient time and means for resetting the capacitor be provided, this method can provide good timing integrity and does not require a floating supply. However the time and/or the circuitry required to reset the capacitor is often an unacceptable burden. Moreover, such a totem-pole requires complementary switch polarities. P-channel devices are generally either less conductive or slower than equivalent N-channel devices, limiting the desirability of the complementary totem-pole. Capacitive driving of non-complementary totem poles usually impresses large common-mode transient voltages across the coupling capacitor, making such drive complex, or even impractical.

U.S. patent application Ser. No. 12/334,692 teaches a charge-retaining switch that may be directly driven by relatively short pulses conveyed to the power device by one or more transformers. The combination of short pulses and the inherent bi-stability of the switch allow the transformer/s quickly to reset. Thus excellent timing integrity may be obtained in the presence of large high-side voltages without a high-side gate-driver supply, and without complex circuitry between the transformer/s and the high-side switch.

U.S. patent application Ser. No. 12/361,074 teaches a DC common-mode level shifter comprising one or more common-mode chokes spanning the common-mode voltage, and being reset to avoid large common-mode currents. In this application, a differential signal floating at a high-common voltage is shown being referred to ground.

BRIEF DESCRIPTION OF THE INVENTION

In the present invention, switch drive pulses, instead of being applied to one or more transformers, are applied to a common-mode choke. These pulses are thereby level-shifted to a high-side voltage to drive a high-side switch. Since the pulses to drive an inherently bistable switch may be made relatively short, and the common-mode choke needs to be connected across the common-mode voltage during the pulses only, the common mode choke has plenty of time to be magnetically reset by convenient circuitry. With an inherently bistable switch, the inductance of the common-mode choke may be made very small. With larger common-mode choke inductances, level-shifting for driving non-inherently-bistable switches may performed. Additionally, since the magnetic field reset occurs largely in the common-mode voltage, and is largely absent from the differential voltage of the common-mode choke, substantially no reset disturbance is applied to the driven switch. According to this invention, a single magnetic device suffices to convey both ON and OFF pulses to the driven switch, and no floating drive supply is needed, yielding excellent timing integrity with great simplicity.

DETAILED DESCRIPTION OF THE INVENTION

Figure 1:
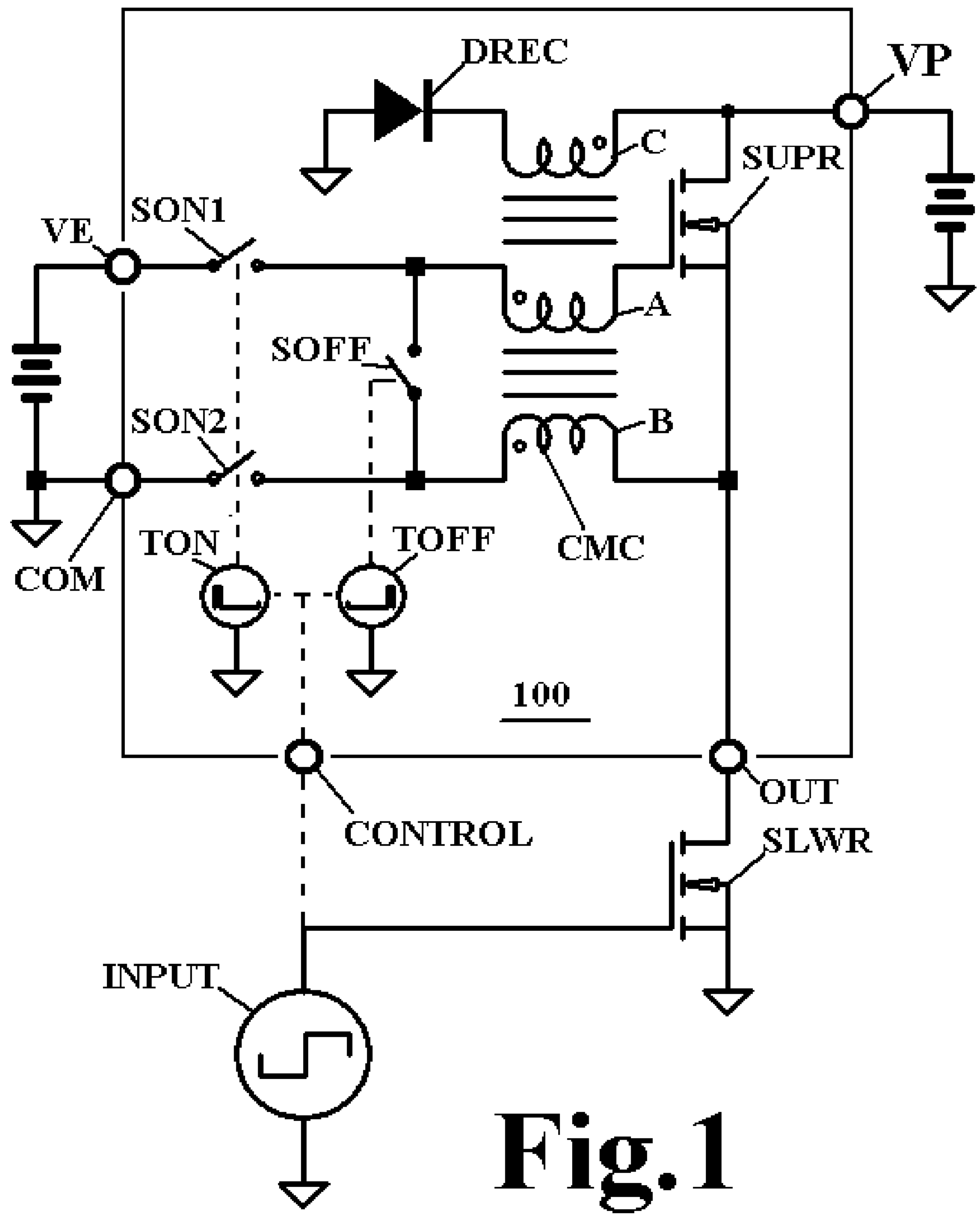
FIG. 1 shows an idealized switch according to the present invention.

Referring to first FIG. 1, there is depicted a switch 100 according to the present invention, shown embedded in a typical totem pole circuit according to the prior art. A power voltage source is shown applied through a terminal VP. A switch enhancement voltage source is shown applied through a terminal VE. A control signal is shown applied through a terminal CONTROL. A totem pole output is shown connected through a terminal OUT. A common return is shown connected through a terminal COM. Inside switch 100 is shown a high-side FET switch SUPR. Outside switch 100 is shown low-side FET switch SLWR. Connected through terminal OUT these two FET's form a well-known totem pole circuit. A control signal from a generator INPUT both controls FET SLWR and enters switch 100 through terminal CONTROL. For the polarity switches used in this figure, SLWR is on when the signal at terminal CONTROL is positive, and off when it is negative.

Inside switch 100, the falling edge of the signal at CONTROL drives a pulse generator TON to produce an ON pulse. This pulse briefly turns on switches SON1 and SON2. Inside switch 100 is common-mode choke CMC, comprising windings A, B, and C. When switches SON1 and SON2 are closed, the enhancement voltage between terminals VE and COM is applied to the dotted poles of windings A and B. Common-mode choke CMC causes the voltage between the dotted poles of windings A and B to be replicated at the respective undotted poles, regardless of the common-mode voltage that may exist at the latter poles. Thus the voltage at VE is applied between the gate and source of FET SUPR, turning it on. Note that external FET SLWR has just been turned off. When the ON pulse is completed, switches SON1 and SON2 open, trapping charge in the gate of FET SUPR, keeping it bistably on.

When the signal at terminal CONTROL rises, two things occur. Inside switch 100 a pulse generator TOFF produces an OFF pulse, briefly closing switch SOFF, thus applying a low resistance to the dotted ends of windings A and B. This low resistance is replicated at the undotted ends of these windings, thereby destroying the charge that was formerly holding FET SUPR bistably on, thus causing that FET to become bistably off. External to switch 100, the signal at terminal CONTROL also turns FET SLWR on.

During the brief time when switch SON2 was on and FET SUPR was also on, the voltage between terminals VP and common was applied to winding B, generating a magnetic field in common-mode choke CMC. When switch SON2 is turned off, common-mode choke CMC has no circuit through which to reset its magnetic field save the path through recovery diode DREC and its winding C. Common-mode choke CMC therefore “flies-back” returning, through DREC much of the energy in its magnetic field through terminal VP to the power voltage source whence it came. If the windings be equal, this reset last approximately as long as the ON pulse. Since the reset voltage, and most ringing, occurs across, rather than between the windings, such disturbances are not applied to the FET SUPR.

Figure 2:
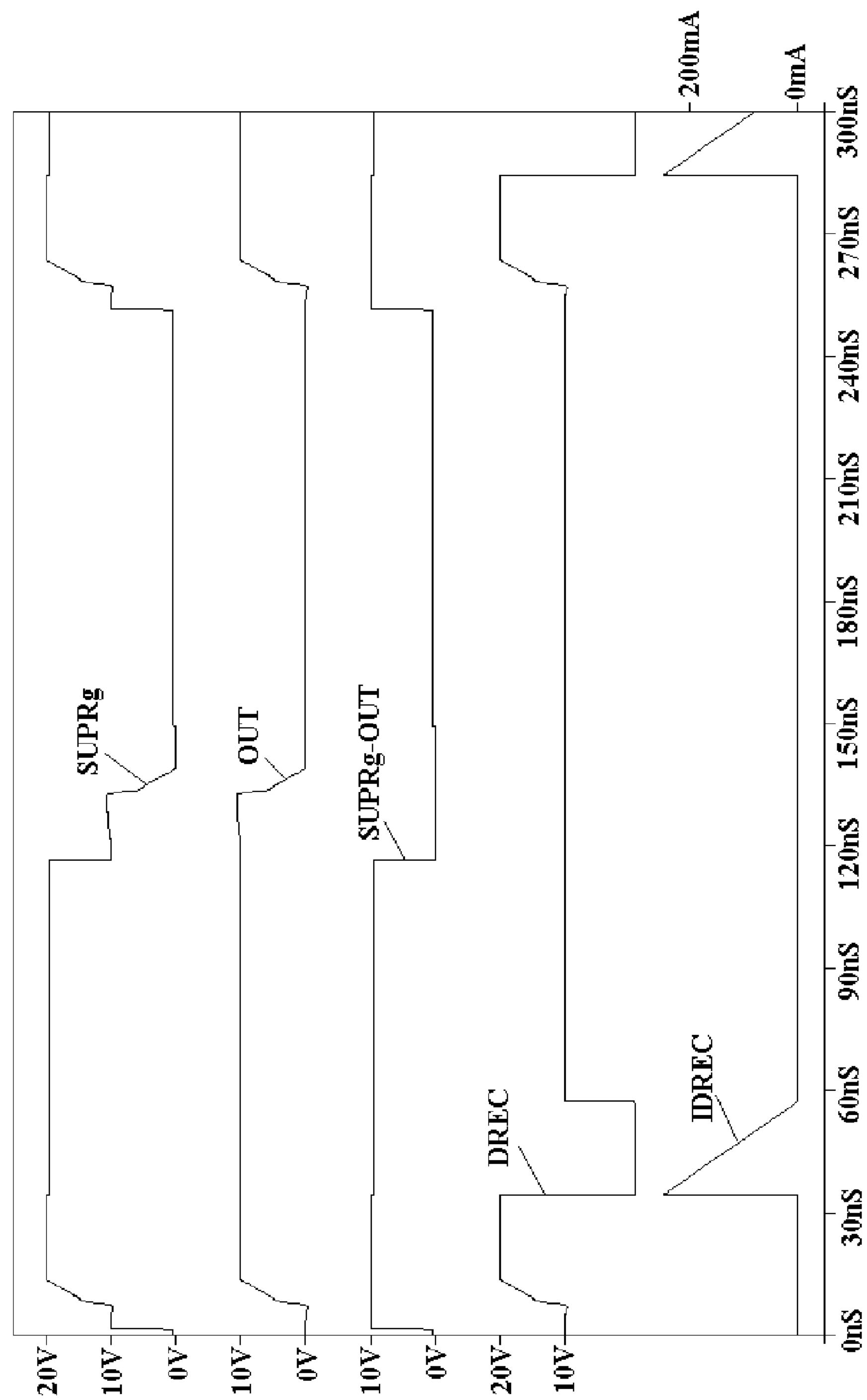
FIG. 2 shows SPICE simulation waveforms of the circuit of FIG. 1.

FIG. 2 shows SPICE simulation waveforms of the circuit of FIG. 1. For this simulation, ideal component models were used, save for the models of FET’s SUPR and SLWR, for which the manufacturer-supplied model for the International Rectifier type IRF6646 was used. An upper trace SUPRg is the gate waveform of FET SUPR. A trace labeled OUT is the voltage at terminal OUT, which is also the source waveform of FET SUPR. Immediately below is a trace labeled SUPRg-OUT which, being the difference of the two waveforms above represents the enhancement applied to FET SUPR. The waveform between the dotted poles of windings A and B is identical to this waveform. Examination of these traces shows that trace SUPRg is trace SUPRg-OUT having been level-shifted by the trace OUT. This level shift has been performed by common-mode choke CMC. Immediately below is a trace DREC which is the voltage across recovery diode DREC. The portion of that trace above 10V is a replica of the common-mode voltage at OUT, whilst the portion below 10V is the flyback voltage of magnetic field reset. During recovery, diode DREC is returning energy to the power voltage source through terminal VP. The chopping frequency in this simulation is 4 MHz. A trace labeled IDREC shows the current in diode DREC, which current is significant only during magnetic field reset.

Figure 3:
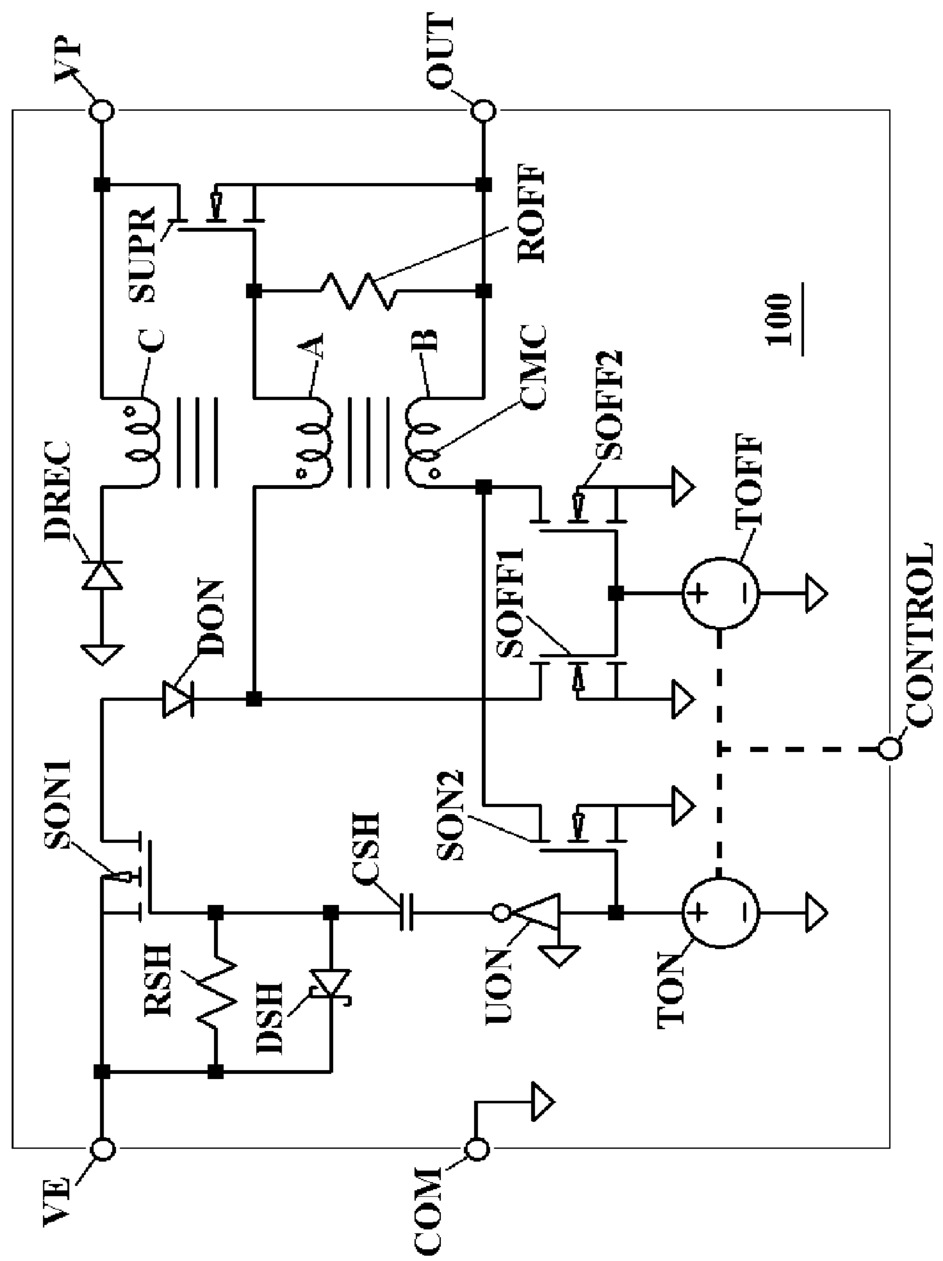
FIG. 3 shows a practical realization of the circuit of FIG. 1.

FIG. 3 shows a practical realization of the circuit of FIG. 1. As in FIG. 1, the FET SUPR is type IRF6646. A resistor ROFF, preferably about 1M, is added to cause FET SUPR to turn off in the event that control pulses cease for more than a few milliseconds. Common-mode choke CMC is preferably about 100 nH for a 10V VP, and is wound on Fair-rite type 61 core material. For low voltages, diode DON may be a Schottky diode such as Infineon type PMEG 6100CEJ. Switch SON1 is preferably a FET, Vishay type Si4433DY. Since this FET blocks unidirectionally, a diode DON, also type PMEG 6100CEJ, is added in series with its drain. Since switch SON1 floats with VE, coupling capacitor CSH is used to level-shift its ON pulse. Diode DSH, preferably industry-standard type BAT54, sets the top of the shifted ON pulse near VE. Resistor RSH keeps the gate voltage of SON1 from drifting negative. UON is an ordinary 5V swing logic inverter such as a Fairchild type NC7SZ04, which provides the inversion needed to drive the P-channel FET SON1. TON and TOFF provide positive-going logic-level pulses, preferably of about 30 nS duration. TON also drives inverter UON and also SON2, preferably Fairchild type FDS6961A. TOFF drives SOFF1 and SOFF2, a pair of FETs, preferably Fairchild type FDS6961A, which together embody SOFF of FIG. 1. This embodiment avoids the inconvenience of driving a FET floating at VP. Since the short-term common-mode voltage of SOFF is of little importance, it is convenient to short-circuit the dotted poles of windings A and B by shorting both to common. For low voltages, DREC, connected to winding C, is also preferably type PMEG 6100CEJ. It should be noted that switches SON2 and SOFF2 can be replaced by a single switch if their drive signals be combined by a well-known OR logic function.

Figure 4:
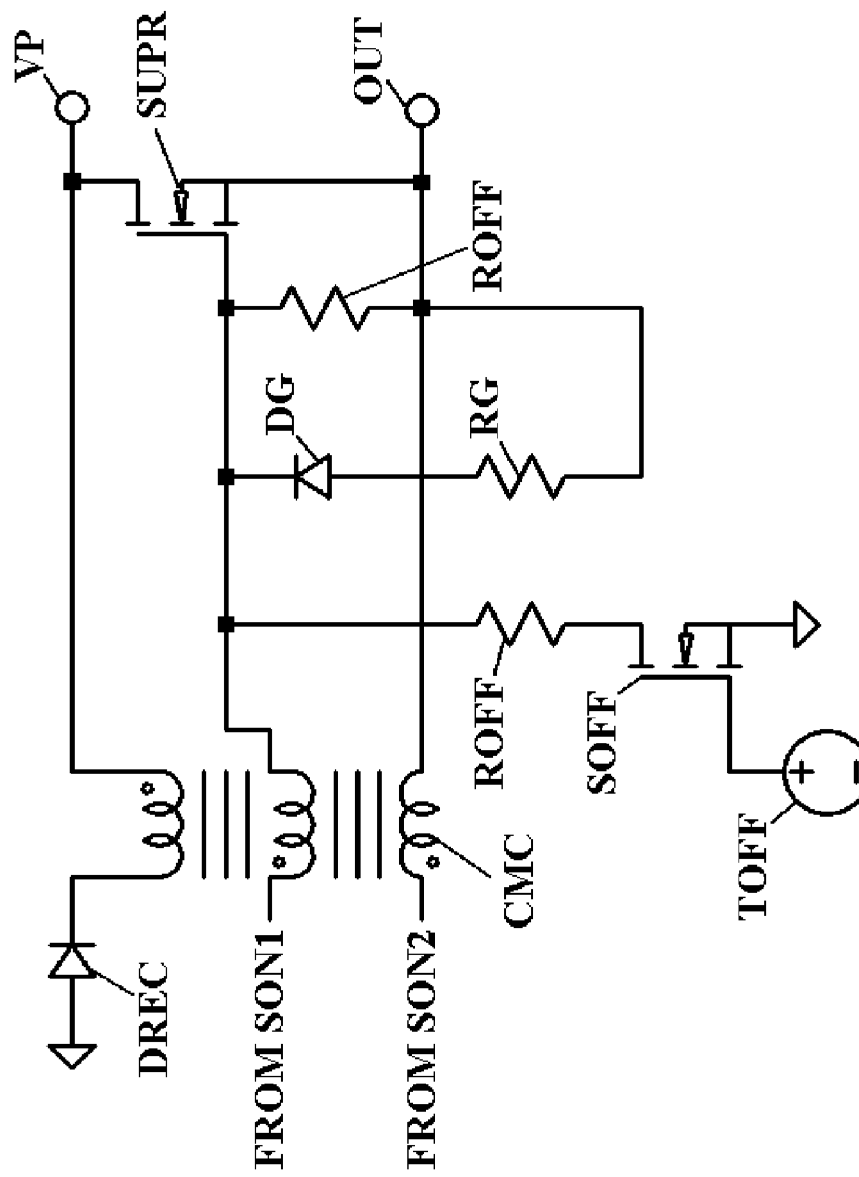
FIG. 4 shows an excerpted portion of the inventive switch in which common-mode choke level-shifting has been applied to the ON pulse path only.

FIG. 4 shows an excerpted portion of the inventive switch 100 in which common-mode choke level-shifting has been applied to the ON pulse path only. Since common-mode choke level-shifting incurs the addition of choke recovery voltage to the voltage excursion to be blocked by the switches, it may be advantageous at higher voltage to relieve SOFF of this stress. The circuit of this figure allows SOFF directly to discharge the gate of SUPR. ROFF is added to limit discharge current and RG and DG are added to prevent excessively negative excursions of the gate of SUPR below its source.

Figure 5:
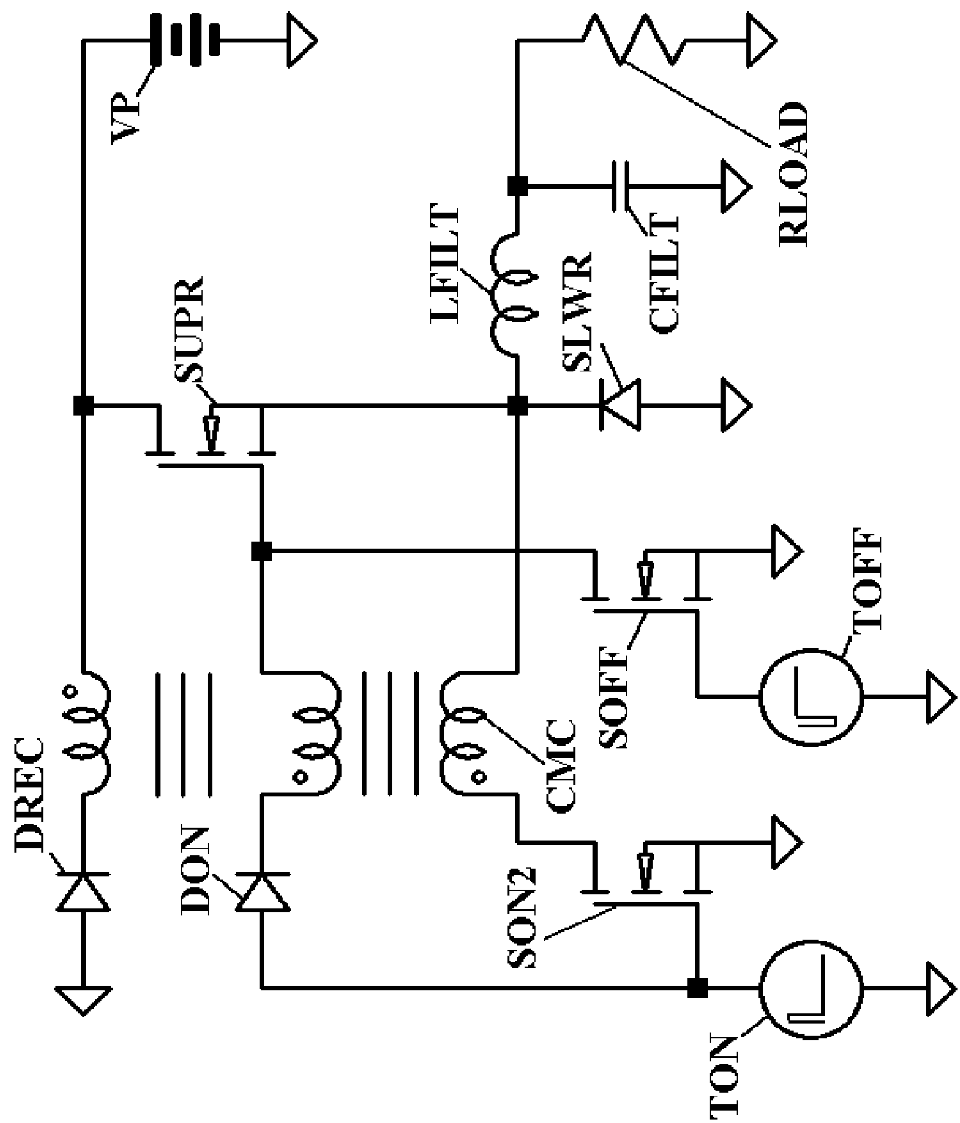
FIG. 5 shows an open-loop buck converter using a common-mode choke to level-shift the drive for the high-side switch.

FIG. 5 shows an open-loop buck converter using a common-mode choke to level-shift the drive for a high-side switch. This converter operates at 100 KHz with about 4% duty cycle to convert 165VDC to 5VDC. Common-mode choke CMC is here preferably about 1 mH. Since diode DREC here must withstand over 300V peaks it is preferably Fairchild type ES1G. SUPR is preferably Vishay type Si9420DY. SON2 is also type Si9420DY. Since this is a CCM buck converter, SLWR may be a diode, here preferably Fairchild type MMBD1501A. DON is also type MMBD1501A. Since but 5V is required to enhance SON2, the logic output of TON acts as switch SON1. TON is a positive 5V logic pulse of about 400 nS duration. TOFF is a positive 5V logic pulse of about 9.58 uS duration, delayed about 10 nS from the trailing edge of the TON pulse. Is should be noted that here neither SUPR nor SLWR is bistable but, due to the small duty cycle required, the common-mode choke CMC has plenty of time to recover. Therefore CMC is able to level-shift the entire duration of the TON pulse. It should be further noted that the 165V level-shift here performed is significant.

Moreover it should be noted that, though this example is directed toward emphasizing the extreme level-shifting capabilities of common-mode choke CMC, operation at lower duty-cycles is perfectly practical. At 50% duty-cycle, the recovery voltage that must be blocked is no higher than at 4%. Since magnetizing reactance of choke CMC is in shunt with source VP, a higher inductance may be required than is usual for well-known gate drive transformers. However since the magnetic field recovery waveform exists in the common-mode, rather than differential choke voltage, it is conveniently accommodated without disrupting enhancement voltages. This figure is also practical using BJTs or other non-gate-charge-retaining switches.

Many variations of the practice of this invention may occur to those skilled in the art. For example, IGBTs may replace the FETs shown here, or complementary FET polarities may be chosen. However, this invention is practiced whenever a common-mode choke is used as a DC level-shifter to provide drive to a power switch. Likewise, this invention is practiced whenever any inherently bistable power switch is driven by a common mode choke, whether the choke is used to level-shift drive signals to a high-side switch or to drive a low-side switch. It should be noted that the recovery winding of common-mode choke CMC may be eliminated if one is willing to incur the energy loss of snubbing, or if the core used be sufficiently lossy to reset the magnetic field in the available time. It should further be noted that diodes may usually be replaced with well-known synchronous rectifiers.

While in the preferred embodiment described, gate charge injection and gate charge removal are implemented through the common-mode choke, in other embodiments only the charge injection or charge removal is implemented with the common mode choke. Likewise instead of a single common mode choke being used, two common mode chokes may be used, the first for charge injection and the second for charge removal.

What is claimed:

1. A substantially bistable power switch comprising:

at least one gate-charge retaining power transistor; and control circuitry responsive to at least one control signal, said control circuitry capable of injecting charge into and removing charge from the gate of the power transistor responsive to the control signal; and at least one common-mode choke connected to the gate of the power transistor through which charge injection or charge removal occurs; wherein the power switch is bistable.

2. The switch of claim 1 wherein the circuit through which current for both gate-charge injection and gate-charge removal passes includes a common-mode choke.

3. The switch of claim 1 wherein the circuit through which current for gate-charge injection only passes includes a common-mode choke.

4. The switch of claim 1 wherein the circuit through which current for gate-charge removal only passes includes a common-mode choke.

5. The switch of claim 1 wherein the circuit through which current for gate-charge injection passes includes a first common-mode choke and the circuit through which current for gate-charge removal passes includes a second common-mode choke.

6. The switch of claim 1 wherein the common-mode choke comprises a recovery winding.

7. The switch of claim 1 wherein a snubber is used to effect magnetic field reset.

8. A method of level-shifting a gate-drive voltage for a power switch, the method comprising:

connecting a gate-drive voltage supply in a circuit with a gate of a power switch via switches and a common-mode choke;

applying a voltage to turn the power switch on or off by closing and opening said switches.

9. The method of claim 8 wherein the power switch is substantially bistable.

10. The method of claim 8 wherein the gate-drive voltage supply is connected in a series circuit with the gate and source of the power switch via the switches and the common-mode choke.

* * * * *